United States Patent [19]

Scapple et al.

[11] Patent Number: 4,597,986

[45] Date of Patent: Jul. 1, 1986

[54] METHOD FOR PHOTOCHEMICAL VAPOR DEPOSITION

[75] Inventors: Robert Y. Scapple, Los Angeles; John W. Peters, Malibu; Jacques F. Linder, Palos Verdes; Edward M. Yee, Canyon Country, all of Calif.

[73] Assignee: Hughes Aircraft Company, Los Angeles, Calif.

[21] Appl. No.: 764,815

[22] Filed: Aug. 12, 1985

Related U.S. Application Data

[62] Division of Ser. No. 636,446, Jul. 31, 1984.

[51] Int. Cl.$^4$ ............................................. B05D 3/06
[52] U.S. Cl. ................................. 427/53.1; 118/50.1; 427/248.1; 427/255.1; 427/255.2; 427/54.1
[58] Field of Search ................... 427/54.1, 53.1, 248.1, 427/255.1, 255.2

[56] References Cited

U.S. PATENT DOCUMENTS

| | | | |
|---|---|---|---|
| 3,391,270 | 7/1968 | Harris et al. | 219/385 |
| 3,460,510 | 8/1969 | Currin | 118/48 X |
| 3,603,284 | 9/1971 | Garnache | 118/48 |
| 3,645,230 | 2/1972 | Hugle et al. | 118/49.5 |
| 3,719,166 | 12/1970 | Gereth | 118/48 |
| 3,806,360 | 4/1974 | Briody | 118/48 X |
| 3,865,072 | 2/1975 | Kirkman | 118/4 |
| 4,022,928 | 5/1977 | Piwcyzk | 427/43 |
| 4,082,865 | 4/1978 | Ban et al. | 427/253 |
| 4,265,932 | 5/1981 | Peters et al. | 427/53.1 |
| 4,371,587 | 2/1983 | Peters | 428/446 |
| 4,422,407 | 12/1983 | Bessot et al. | 118/723 |
| 4,499,853 | 2/1985 | Miller | 118/725 |

FOREIGN PATENT DOCUMENTS

0784198 4/1968 Canada ............................ 427/54.1

Primary Examiner—Thurman K. Page
Attorney, Agent, or Firm—Mary E. Lachman; A. W. Karambelas

[57] ABSTRACT

An apparatus for photochemical vapor deposition includes an outer reactor shell and a concentric inner shell which define a photochemical reaction zone. A radiation source is centrally located within the transparent inner shell, which isolates the radiation source from the vapor phase reactants present in the reaction zone. A rotating gas manifold is located within the reaction zone to uniformly distribute the vapor phase reactants within the reaction zone. Protective liquid is continually applied to the outer surface of the inner shell and spread into a thin film by wiper blades, to prevent deposition of reaction products onto the outer wall of the inner shell. The central location of the radiation source, along with the protective liquid film, make optimum usage of the reaction-inducing radiation generated by the radiation source. In addition, the rotating gas manifold promotes uniform deposition of layers of selected materials on substrates placed within the reaction zone.

5 Claims, 2 Drawing Figures

METHOD FOR PHOTOCHEMICAL VAPOR DEPOSITION

The Government of the United States of America has rights in this invention pursuant to Contract No. DAAK60-83-C-0080 awarded by the Department of the Army.

This is a division of application Ser. No. 636,446, filed July 31, 1984.

BACKGROUND OF THE INVENTION

1. Field of the Invention

The present invention relates generally to apparatus and methods for coating thin films of selected materials onto various substrates by photochemical vapor deposition. More particularly, the present invention relates to an improved high throughput reactor which makes optimum use of radiation generated within the reactor and provides uniform dispersion of vapor reactants to produce uniform deposited layers.

2. Description of the Background Art

The use of radiation to photochemically induce the deposition of thin layers on various substrates has become a particularly useful technique due to the relatively low temperatures at which deposition can be carried out. Photochemical vapor deposition has wide application to depositing thin films of a variety of materials, such as nitrides, oxides, or sulfides, on numerous substrate materials, such as semiconductor materials, metals, plastics, and glass. Photochemical vapor deposition processes are especially well-suited for treating substrates, such as temperature-sensitive plastics and many compound semiconductor materials, which cannot be subjected to the high temperatures usually required for more conventional thermal vapor deposition techniques.

Photochemical vapor deposition processes are well-suited for use in the fabrication of semiconductor devices and integrated circuits. For example, it is desirable to deposit a thin layer of silicon nitride ($Si_3N_4$) onto semiconductor devices as a passivation layer to prevent contamination of the device. In U.S. Pat. No. 4,265,932, which is assigned to the present assignee, there is disclosed an apparatus of the conventional planar geometry comprising a flatbed-type vacuum envelope containing a horizontal heated substrate holder and closed on top by a fused quartz window. Using such an apparatus, a silicon nitride layer is deposited on a silicon substrate using a mercury photosensitized reaction between silane ($SiH_4$) and ammonia ($NH_3$). The process is based upon the use of ultraviolet radiation to excite mercury vapor in the reactor to form mercury in an excited state. The excited mercury then collides with the silane and ammonia to produce activated species thereof, which interact to form the desired silicon nitride deposit. The photochemical reactor apparatus disclosed in U.S. Pat. No. 4,265,932 utilizes a horizontal reaction chamber in which a quartz window integral with the top of the reactor is provided. The ultraviolet radiation necessary to induce the photochemical reaction is produced external to the reaction chamber and transmitted through the quartz window into the reaction chamber.

A common problem experienced by known photochemical reactors is the undesirable deposition of the selected compound (e.g., silicon nitride) onto the quartz window. The formation of a deposited layer of an opaque material such as silicon nitride on the quartz window reduces the amount of radiation transmitted into the reaction chamber and as a result decreases the efficiency of the reaction. In U.S. Pat. No. 4,265,932 this problem was overcome by placing a thin sheet of ultraviolet-transparent material over the internal surface of the quartz window. The thin sheet was mounted on rollers so that it could be continually moved across the quartz window to continually provide a fresh portion of the sheet over the quartz window and thereby maintain transmission of radiation through the quartz window at maximum levels.

Other materials which can advantageously be deposited by photochemical vapor deposition at relatively low temperatures are dielectric oxides, as disclosed in U.S. Pat. No. 4,371,587, which is also assigned to the present assignee. The apparatus disclosed in this latter patent is suitable for conducting photochemical vapor deposition onto various substrates, such as semiconductor devices, metal layers, lenses, mirrors and solar cells. The use of the apparatus disclosed in U.S. Pat. No. 4,371,587 is illustrated for the deposition of a layer of silicon dioxide ($SiO_2$) onto silicon substrates, as in semiconductor device fabrication. This latter apparatus, like the apparatus disclosed in U.S. Pat. No. 4,265,932, includes a flatbed-type reaction chamber having a quartz window in the top through which radiation is transmitted. The substrates are located horizontally within the reaction chamber and the reactant gases are flowed into the chamber through a side wall. The photochemical vapor deposition process may be mercury-sensitized, in which the radiation is absorbed by the mercury atoms to produce excited mercury atoms which then react with an oxygen-containing precursor to produce atomic oxygen which, in turn, reacts with a vapor phase reactant to deposit the desired oxide. Optionally, the required atomic oxygen may be formed by the direct dissociation of the oxygen-containing precursor by radiation of a selected wavelength, in which case mercury sensitization is not used.

Although the apparatus as described in the two above-noted patents are well-suited for their intended purpose, neither reactor is designed to be used in a commercial setting where a large number of substrates must be processed quickly, efficiently, and economically to provide substrates having uniform, high quality films. It would therefore be desirable to provide an improved reactor which is capable of processing a large number of individual substrates at any given time while also providing high quality, uniform deposited layers and improved efficiency and economy.

SUMMARY OF THE INVENTION

In accordance with the present invention, an improved photochemical vapor deposition apparatus and method is provided in which a large number of substrates can be routinely treated to provide high quality surface deposits which are uniformly distributed over the substrate surface. The apparatus is further designed to provide optimum use of the radiation which is generated within the apparatus to induce the photochemical reaction.

The present invention is directed to a photochemical vapor deposition apparatus which includes an outer reactor shell and a concentric inner shell defining a photochemical reaction zone. A radiation means for producing radiation of a predetermined wavelength or combination of wavelengths necessary to induce the desired photochemical reaction is located centrally within the central space defined by the inner wall of the inner shell and is isolated from the reaction zone by the inner shell. The inner shell is transparent with respect to the particular wavelength or wavelength range of the reaction-inducing radiation.

A gas manifold is provided for introducing the vapor phase reactants into the reaction zone. The gas manifold includes a plurality of spaced outlets which are located between the inner shell and the outer reactor shell with the outlets being directed toward the inner wall of the outer reactor shell. Means are provided on or adjacent to the inner wall of the outer reactor shell for mounting the various substrates to be treated. As one particular feature of the present invention, means are provided for rotating or otherwise moving the gas manifold relative to the substrates to provide uniform dispersion of the gaseous reactants from the outlets outward and toward the substrates. The uniform distribution of the vapor reactants promotes uniform deposition of the selected material on the substrates. Gas exhaust means are provided to remove unreacted gases and reaction side products from the reaction zone atmosphere.

The outer wall of the inner shell for the central radiation source is provided with a protective film to prevent undesirable deposition of the selected deposited layer material onto the outer wall of the inner shell. Optionally, means are provided for applying a film of protective liquid to the outer wall of the inner shell. The protective liquid film, like the inner shell, is transparent to the radiation produced within the inner shell. The protective liquid film is produced by introducing the protective liquid onto the upper portion of the outer wall of the inner shell and then spreading the liquid into a thin film by continuous rotary motion of wiper means which extend the length of the side wall of the inner shell and in contact therewith. The exposed liquid then flows down the side wall and into a collector tray, while fresh protective liquid is continually introduced at the upper portion of the outer wall of the inner shell.

Preferably, both the inner wall of the outer reactor shell and the inner shell surrounding the radiation source are cylindrical in shape to provide a cylindrical reaction zone extending between the two surfaces. This type of barrel reactor is especially well-suited for use in a commercial setting where a large number of substrates must be uniformly and efficiently coated. Locating the radiation source in the center of the apparatus maximizes the effective utilization of the ultraviolet or other radiation energy. Further, the reactor and substrates are oriented vertically, which reduces film defects due to particulates which may settle onto the substrates.

The above-described and many other features and attendant advantages of the present invention will become better understood by reference to the following detailed description when considered in conjunction with the accompanying drawings.

DETAILED DESCRIPTION OF THE INVENTION

Figure 1:
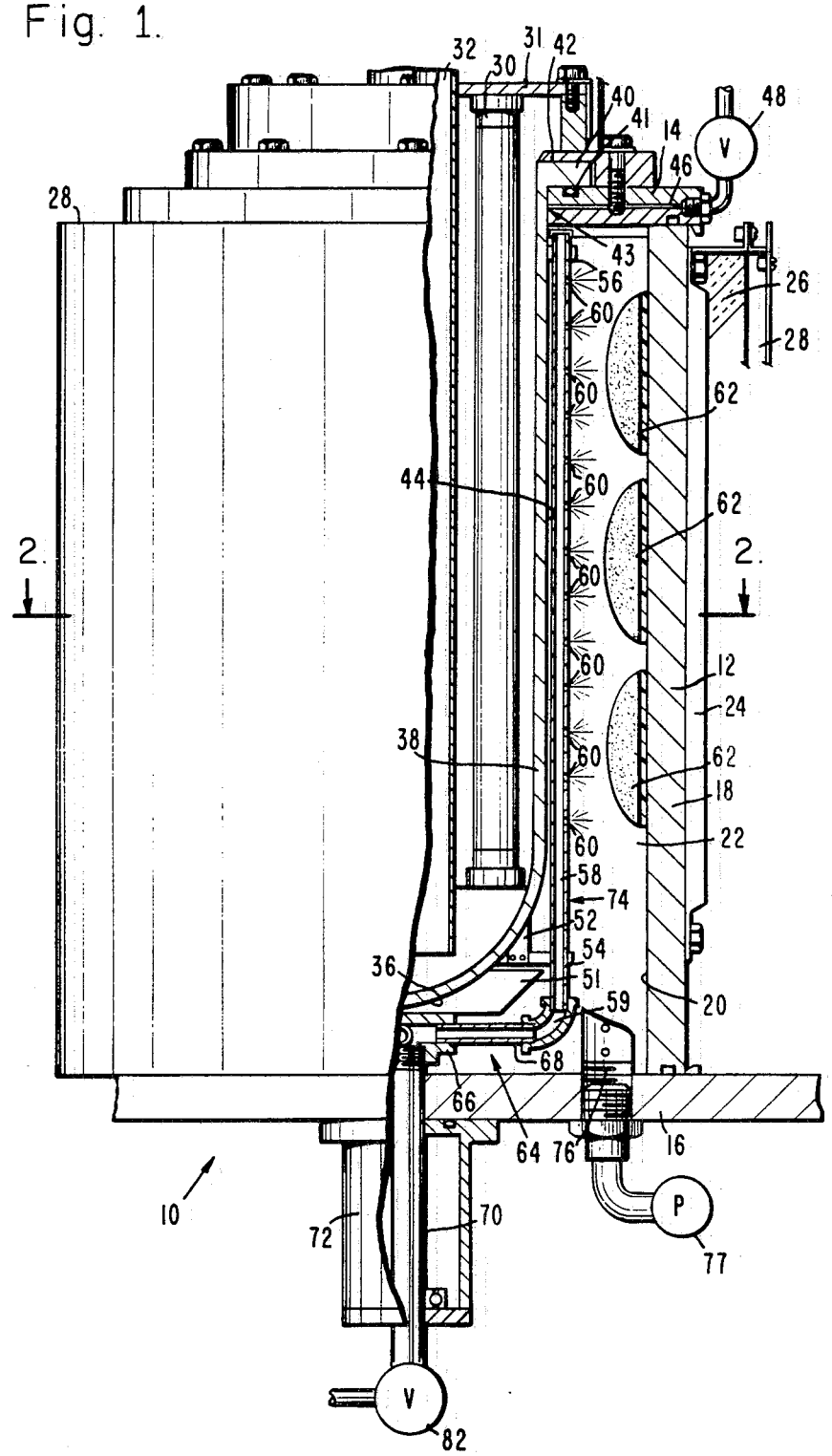
FIG. 1 is a partial sectional side-view of a preferred embodiment of a reactor in accordance with the present invention.
Figure 2:
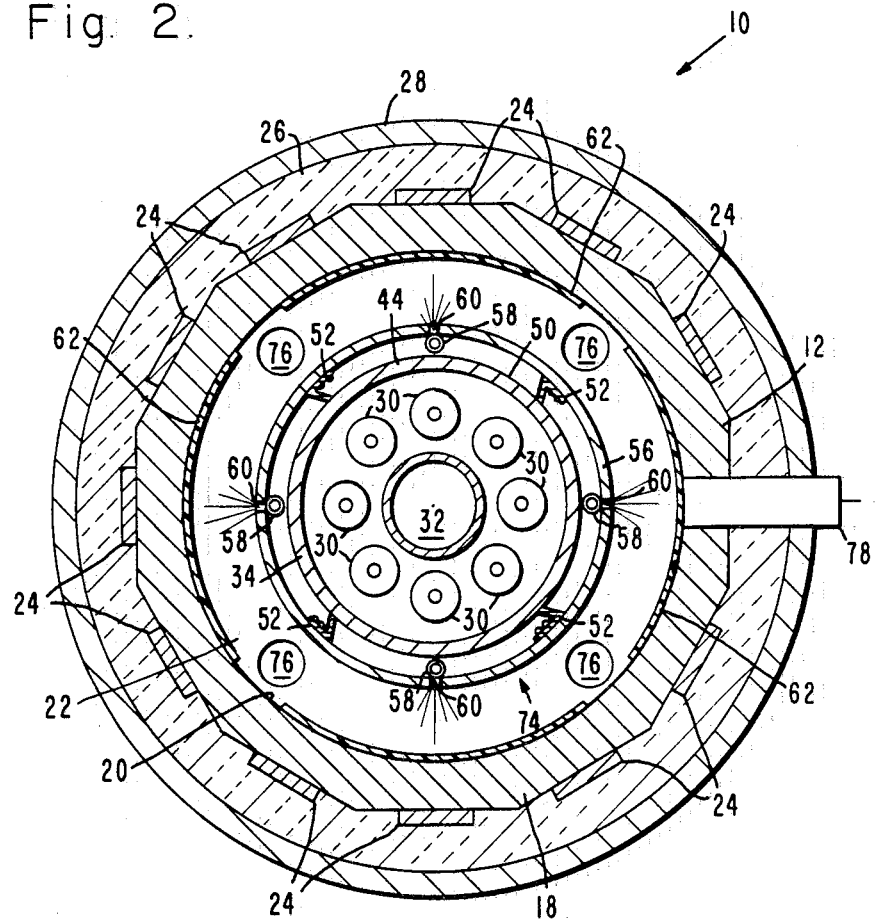
FIG. 2 is a cross-sectional view of FIG. 1 taken in the 2—2 plane.

A preferred reactor for photochemical vapor deposition in accordance with the present invention is shown generally at 10 in FIGS. 1 and 2. The reactor 10 includes an outer reactor shell 12. The outer reactor shell 12 includes a top 14, side wall 18, and bottom 16 and may be formed of a heat-conductive metal, such as aluminum. The inner surface 20 of side wall 18 forms the outer limit of a cylindrical reaction zone 22, with the inner limit of the reaction zone being defined by the outer wall of the inner shell 34 described below. The top 14 and bottom 16 are each attached to the side wall 18 by a sealing means, such as a vacuum seal. This separable configuration is required for ease of accessibility, such as to accomplish loading of the substrates to be treated, as discussed in greater detail herein. In addition, the top 14 is provided with a means for attachment to a hoist (not shown) which is used to separate the top 14 from the remainder of the outer reactor shell 12 during the substrate loading described herein. The inner surface 20 of side wall 18 is provided with a multiplicity of blind threaded holes (not shown) with which the substrates may be fastened to the inner surface 20 as described herein.

Means for maintaining the temperature within the reaction zone 22 at desired predetermined levels is provided by heating elements 24 which are located circumferentially around the outside of the outer reactor shell 12. The heating elements 24 can be any of the well-known conventional heating elements, such as strip heaters manufactured by Chromalox of El Monte, Calif., which are capable of maintaining the reaction zone 22 at the desired temperature level. Typcially, temperatures used in photochemical vapor deposition processes are between room temperature and 300° C., since the use of such low temperatures is advantageous for many applications. Heating elements capable of maintaining higher temperatures within the reaction zone may be utilized when the particular photochemical vapor deposition reaction requires higher temperatures. The temperature used depends on the thermal stability of the substrate and the properties of the deposited material, which may require increased temperature, for example to produce densification. There is also provided a thermocouple device (not shown) in close proximity to the outer reactor shell 12, which measures the temperature of the outer shell 12 and converts this measurement to an electrical signal which is input to a temperature control means (not shown). The temperature control means adjusts the power to the heaters 24 in response to the signal from the thermocouple device, as required in order to maintain the outer shell 12 at the desired temperature.

Insulation material 26 is provided surrounding heating elements 24 and outer reactor shell 12 to insulate the outer reactor shell and allow precise control of temperatures within the reaction zone 22. Further, an outer casing 28 is provided to enclose the entire reactor apparatus. Thus, the temperature of the substrates is well-controlled by the heating elements 24, which are the only source of heat for the substrates in this photochemical vapor deposition process.

Radiation means such as ultraviolet lamps 30 are located centrally within the central space defined by the inner wall of the inner shell described below and are isolated from the reaction zone 22 by the inner shell. The ultraviolet (UV) lamps 30 in the preferred embodiment are low pressure mercury vapor lamps with major resonance lines at wavelengths of 2537 angstroms and 1849 angstroms, such as those obtained from Canrad-Hanovia, Inc. of Newark, N.J. Ultraviolet lamps producing ultraviolet radiation of different wavelengths and other radiation sources, such as microwave generators and radio frequency generators, may be used in place of the UV lamps 30 to provide the desired wavelength or combination of wavelengths of radiation necessary to induce the desired photochemical vapor deposition reaction. Alternatively, an ultraviolet laser may be used to provide the required radiation, in combination with a means for distributing the laser beam over an increased surface area. As shown in FIG. 2, a series of eight ultraviolet lamps is used in the preferred embodiment of the present invention. However, the number of UV lamps used may be varied depending on the diameter of the reaction zone 22 and the distance from the UV lamps 30 to the substrates 62, and is chosen to provide a sufficient intensity of radiation to enable a satisfactory rate of deposition of the desired material. The configuration of the ultraviolet lamps 30 placed in a circle to irradiate a reaction zone with circular outer walls, as shown best in FIG. 2, provides maximum utilization of the radiation produced by the lamps 30 since the arc describing the lamp surface from which radiation enters the reaction chamber is much larger for this circular configuration than for the known flat chamber design previously discussed herein. In addition, such a circular configuration of the lamps increases the uniformity of the radiation due to multiple reflections of the radiation. Further, the centrally-located radiation source permits maximum capture of any scattered and reflected radiation energy by the vapor phase reactants. Optionally, in order to further increase the uniformity of the reaction-inducing radiation, means may be provided for rotating the series of lamps 30 in mass about the inner wall of the inner shell 34, discussed below. As a further option, the outer wall of the cooling tube 32, discussed below, may be coated with a reflective material, such as an aluminum film, to reflect radiation from the back side of lamps 30 toward the reaction zone 22. For convenience, all lamps 30 may be mounted in a light socket support structure 31 which supports the lamps and through which electrical contact to the lamps is readily established.

In order to provide optimum generation of ultraviolet radiation, it is important that the ultraviolet lamps 30 be maintained at a temperature below 100° C. and prefearbly 50° C. Cooling tube 32 is located centrally within the array of ultraviolet lamps 30. Cooling liquid or gas is passed continually down through cooling tube 32, exits at the bottom of tube 32, enters at the bottom internal surface of the inner shell 34, and passes up around the lamps 30 to maintain the temperature of the lamps 30 at or below the desired temperatures. Other cooling means may be used so long as the temperature of lamps 30 is maintained at or below the desired level.

Inner shell 34 is a cylindrical bell jar-shaped housing which surrounds the UV lamps 30 to isolate them from the reaction zone 22 and the vapor phase reactants in the reaction zone, and, further, defines the inner limit of the reaction zone. The inner shell 34 must be made from a suitable material which is transparent to the particular wavelength of radiation which is desired to be transmitted from the radiation sources 30 through the inner shell 34 and into the reaction zone 22. For photochemical vapor deposition processes requiring ultraviolet radiation, it is preferred that the inner shell 34 be made from vitreous quartz. Other suitable materials can be used so long as they allow transmission of radiation of the desired wavelength, are chemically inert with respect to the reactant gases, are capable of withstanding the particular temperature necessary to carry out the photochemical reaction, and are capable of withstanding the pressure differential between the ambient atmosphere in which the lamps 30 are located and the vacuum of the reaction zone 22.

Although other shapes are possible, it is preferred that inner shell 34 have a cylindrical side wall 38, flanged top 40, and domed bottom 36 in order to provide physical integrity to the structure under vacuum. The top 40 is designed to be sealably connected to the outer reactor shell 12 as shown at 42 to allow for access to the lamps 30. Any convenient means may be used for sealing the housing to the reactor shell, such as O-ring 41 or other suitable means, so long as a vacuum-tight seal is provided to prevent the escape of vapor reactants from the reaction zone 22 or the entry of contaminant gases from the external environment into the reaction zone.

Since the reaction products of some photochemical vapor deposition processes (e.g., $Si_3N_4$) are opaque, the accumulation of such reaction products on the outer surface 44 of inner shell 34 would reduce the transmission of the ultraviolet radiation or other radiation being used in the process. Since the rate of deposition is directly dependent on the intensity of the radiation passing into the reaction zone 22 through the side wall 38 of inner shell 34, it is important that the outside surface 44 of the inner shell be maintained in a clean and transparent state.

In order to prevent undesirable deposition of the reaction products onto the outer surface 44 of inner shell 34, the surface 44 may be coated with a film of a selected material, such as a perfluorinated polyether to a thickness in the range of about 0.2 to 20 micrometers, for example, by known methods of spraying, painting, or rolling. However, in practice it has been found that such polymer coatings degrade wtih repeated use and must be removed and a new coating re-applied. This degradation is evidenced by the appearance of a yellowish color in the film and may be due to cracking of the polymer by the ultraviolet radiation or the incorporation of the reaction products into the film. While replacement of such a coating may be feasible in certain applications, it has been found advantageous for applications requiring extensive continuous processing times to apply such a protective coating in another fashion. In the preferred embodiment of the present invention, a protective material in liquid form is applied around the top of the inner shell 34 at locations adjacent flange 40 (as shown generally at 43), then spread into a film by a wiping means described below, and finally allowed to flow down the cylindrical side wall 38 and domed bottom 36 and to flow into collector tray 51. In this manner, protective liquid which has been exposed to the reactive environment and has possibly been degraded thereby as discussed above is continually removed and replaced with a film of fresh protective liquid. Any conventional means may be used for introducing the liquid onto the outer surface 44 of inner shell 34. As best shown in FIG. 1, it is preferred that the protective liquid be introduced through conduit 46, which is a cylindrical conduit leading to the top surface of the cylindrical side wall 38 above the wiper blades 52 discussed below, which provide uniform distribution of the protective liquid around the outer surface 44 of inner shell 34. The control of liquid flow into conduit 46 is provided by valve 48, such as a needle valve. Liquid flow is controlled so that the liquid flows continuously down the outer surface 44 of inner shell 34 to form a thin liquid film (not shown) adhering to the surface 44.

Any suitable protective liquid may be used to produce the desired protective layer, so long as it protects the inner shell 34 from undesirable deposition of reaction products and also is inert with respect to the vapor reactants and reaction products, stable at the temperatures within the reactor and transparent to the particular wavelength of the radiation being utilized. Further, the liquid should have a relatively low adhesive affinity for the reaction products or material to be deposited on the substrates. The term "adhesive affinity" is used herein to mean the probability for attraction and adhesion of the photochemical reaction products or fragments thereof on the liquid film. In addition, the liquid film must have a sufficiently low vapor pressure at the elevated temperatures required for the various deposition reactions so as not to produce contamination of the deposited layer. Further, a low vapor pressure for the liquid film is desirable in order to keep evacuation times short when the vapor deposition process requires a vacuum in reaction zone 22.

A preferred liquid film coating material is a perfluorinated polyether. Particularly preferred perfluoro polyether materials which may be used are any of a series of compounds sold under the trademark name Fomblin by the Montecatini Edison Company, which were chosen to provide a liquid having a sufficiently low viscosity to be applied to the outer surface 44 of inner shell 34 at location 43 by way of application conduit 46 and valve 48. Further, the viscosity of the protective film must be low enough so that the liquid can be readily spread into a uniform thin film by the wiping means and will then flow down the side wall 38 of inner shell 34 and flow off the domed bottom 36.

In order to produce a thin uniform film of the protective liquid along the entire length of side wall 38 of inner shell 34, wiping means, such as a wiper blades 52, are provided, as best shown in plurality in FIG. 2. The wiper blades 52 have a length equal to or greater than the length of the side wall 38 and are formed from a resilient material, such as a rubber or polytetrafluoroethylene, which is compatible with the photochemical reaction being conducted. The wiper blades 52 extend the length of the side wall 38, with which they are in contact, as best shown in FIG. 2. Upon rotation of the blades 52 relative to the side wall 38, the protective liquid which has been introduced through conduit 46 as described above is spread or wiped into a thin uniform film covering the entire outer surface 44 of the side wall 38. Continuous wiping motion of the blades 52 provides a constant thin film of protective liquid on the side wall 38. The film has an estimated thickness of 0.01 to 1.0 mil ($2.54 \times 10^{-5}$ to $2.54 \times 10^{-3}$ cm) and is not readily visible since it is transparent to visible light as well as ultraviolet radiation. In practice, one or more wiper blade 52 may be used as required to produce the thin film, with four blades being illustrated in FIG. 2. Since the blades interrupt the light source 30, it is advantageous to use a minimal number of blades. The blades are rotated around the side wall 38, preferably at a rate of 2-15 revolutions per minute (rpm) by means of shaft conduit 70 as described below with regard to rotation of the gas distribution tubes. The wiper blades 52 are preferably mounted in a fixed position to mounting rings 54 and 56 which are located concentrically around the cylindrical inner shell 34. The rings 54 and 56, along with the wiper blades 52 extending therebetween, form a cylindrical cage structure which is concentrically positioned about the outer wall 38 of the inner shell 34. As previously noted, the protective liquid which has been exposed to the reactive environment gradually flows down the length of the side wall 38 of the inner shell 34 and flows into collector tray 51 for removal upon completion of the deposition cycle.

Gas manifold means such as a plurality of gas distribution tubes 58 are provided for introducing the vapor phase reactants such as silane and nitrous oxide, or other gaseous reactants used in the desired photochemical vapor deposition reaction. The number of gas distribution tubes used depends on among other things, the volume of the reaction zone 22, and is chosen to provide a uniform distribution of the reactant gases throughout the reaction zone. The gas distribution tubes 58 are evenly spaced about the side wall 38 of inner shell 34 and are mounted on the mounting rings 54 and 56 and extend longitudinally parallel to the side wall 38 and in close proximity thereto, e.g., within 1 to 3 cm. The gas distribution tubes 58 include a plurality of spaced gas outlets 60 through which the reactant gases are introduced into the reaction zone 22. The gas outlets 60 are positioned to direct the reactant gases outwardly into reaction zone 22 and toward the substrates 62 which are mounted circumferentially around the inner wall 20 of outer reactor shell 12. Any suitable substrate holder means may be utilized for mounting the substrates 62 on or in proximity to the inner wall 20 of outer reactor shell 12, as discussed n further detail below.

Means for introducing the various reactant vapors into the gas distribution tubes 58 is provided by a central gas manifold hub shown generally at 64 in FIG. 1. The gas manifold hub 64 includes a central distributor hub 66 and connecting conduits 68 which connect the central hub 66 to the gas distribution tubes 58. Elbow joints 59 are provided for connecting the connecting conduits 68 to the gas distribution tubes 58. The gases required for a particular reaction, such as silane and nitrous oxide or silane, ammonia, and mercury vapor, are combined in the required ratios external to the apparatus shown in FIG. 1 and the mixture of reactant gases is introduced into the apparatus of FIG. 1 through shaft conduit 70 at a controlled flow rate by means of valve 82, and into gas distribution tubes 58. Optionally, valve 82 may be replaced with a combination of mass flow controllers by which the reactant gases are individually introduced directly into shaft conduit 70. This option is especially useful when control of the gas flow by electrical means is desired, such as in a computer-controlled system.

Preferably, the central gas manifold hub 64 is mounted on shaft conduit 70. Shaft conduit 70 is rotated by a suitable motor, such as the motor shown schematically at 72 in FIG. 1. Preferably, shaft conduit 70 is rotated at a speed of 2-15 rpm. The rotation of shaft conduit 70 results in rotation of the cage structure, defined by mounting rings 54 and 56 and the wiper blades 52 and gas distribution tubes 58 extending longitudinally between the two mounting rings. Rotation of the cage structure shown generally at 74 continually rotates the wiper blades around the outer surface 44 of inner shell 34 to provide continual wiping of the protective liquid into a uniform film as previously discussed. In addition, rotation of shaft conduit 70 provides continual movement of the gas outlets 60 relative to the substrates 62 to provide uniform dispersion of the gas reactants and thereby ensure uniform deposition of the desired layer of material onto each substrate 62, as well as uniformity of the deposited layer from one substrate to the next.

Thus, using the apparatus of the present invention, problems due to the uneven distribution of the reactant gases that occur in known flatbed-type reactors are overcome. One such problem is caused by the fact that the reactant gases are introduced at one end of the flatbed reaction chamber and exhausted at the opposite end. Since the reactant gas mixture becomes depleted as the photochemical reaction occurs, downstream deposition rates in such flatbed reactors may be significantly less than upstream deposition rates, leading to varying thicknesses of deposit from one substrate to the next. In addition, due to the depletion of reactants, the composition of the material deposited downstream in a flatbed reactor may differ from that of the material deposited upstream, leading to varying compositions of deposit from one substrate to the next. Further, the reaction chamber walls affect local gas flow patterns or deposition temperature, and substrates or portions of a substrate located closer to the reaction chamber walls would be subjected to these effects more than substrates or portions of a substrate located farther from the chamber walls. The apparatus of the present invention overcomes these problems by the cylindrical design of the reaction chamber and the rotating gas distribution means previously discussed.

Gas outlets or exhaust ports 76 are provided at locations around the bottom of the outer reactor shell 12 to provide removal of undesired materials, such as unreacted gaseous reactants and non-deposited reaction products and particles, and, further, to provide an inlet at which a vacuum system shown schematically at 77 can be connected to the reactor to produce the desired vacuum in reaction zone 22 to carry out the photochemical deposition reaction. Vacuums on the order of approximately 0.1 to 50 torr (millimeters of mercury) are generally used in photochemical vapor deposition reactions, which is a sufficiently low pressure to provide a suitable mean free path for the activated reactive species, such as atomic oxygen, and an acceptable rate of reaction. Other reduced pressures besides those specifically mentioned herein may be used as required.

The substrates to be treated may be attached directly to the inner surface 20 of outer reactor shell 12. When treating a curved substrate, such as a plastic optical lens, the lens may be provided with one or more holes in the central or nosepiece area, through which a fastening means, such as a screw, is inserted and fastened into a matching hole in the surface 20 to attach the substrate directly to the inner surface 20. When treating a planar substrate, such as a 3-inch (7.62 cm) silicon wafer for semiconductor device fabrication or an integrated circuit, it may be necessary to provide a saddle-type structure to fill in the curved space between the outer reactor shell 12 and the substrate. The saddle structure is attached to the outer reactor shell 12 and the substrate is attached to the saddle structure by a suitable holding or fastening means, such as a bracket or screw.

Optionally the substrate may be attached to a substrate holder, rather than directly to the outer shell 12. A suitable substrate holder may comprise, for example, a hollow cylinder having a diameter such that the holder fits within the outer reactor shell 12 and in close proximity to the inner surface 20 thereof, and being formed of aluminum high quality stainless steel, or graphite coated with silicon carbide. Optionally, the substrate holder may be provided with recessed spaces formed therein for holding individual substrates. The shape of the recesses is advantageously conformed to the shape of the substrate being processed. For convenience in loading and unloading the substrates, the cylindrical substrate holder may be hinged along its length to allow opening of the cylindrical substrate holder and ready access to the inner surface thereof.

Because of the cylindrical construction of the reaction chamber of the present invention, it has been found that the present apparatus is particularly well suited for treating plastic optical lenses which are themselves somewhat cylindrically curved and fit readily within the curvature of the reaction chamber wall, as generally illustrated in FIG. 2. The substrate surface on which the desired material is to be deposited faces toward the reaction zone 22. To prepare the substrates for treatment in accordance with the present invention, the substrates are first loaded onto the outer reactor shell. A hoisting means is attached to the top 14 of the outer reactor shell 12 and the top 14, including attached inner shell 34 and lamps 30, is separated from the sidewall 18 of the outer reactor shell 12 and moved aside. Then, the substrates are attached to the inner surface 20 of outer reactor shell 12 as previously described. Alternatively, the substrates are attached to a substrate holder which is then lowered into the outer reactor shell 12. Finally, the top 14 is replaced and sealed to the side wall 18 of outer reactor shell 12.

The cylindrical configuration of the reaction zone of the apparatus of the present invention provides a substantially increased surface area for the exposure of substrates to the reactive environment, as compared to known flatbed reactors. Consequently, an increased number of substrates (e.g. up to 50 three-inch wafers) can be processed in one deposition cycle to provide a higher throughput. In addition, the vertical orientation of the substrates in the apparatus of the present invention significantly reduces film defects due to particulate material formed during the deposition process which typically settles onto substrates which are horizontally oriented as in a flatbed-type deposition chamber. The settling of particulate material is minimized in the apparatus of the present invention.

For certain processes, it may be desirable to monitor certain physical or chemical properties, such as the rate of deposition, thickness, or composition, of the deposited layer on the substrates during operation of the reactor. Any suitable monitoring device, such as the thickness monitoring device, shown schematically at 78 may be optionally used. A witness substrate (not shown) is positioned in close proximity to the monitor 78 and is deposited with the same material as the substrates 62. At various stages during the deposition process, the deposit on the witness substrate is examined with the monitor 78. The actual conditions under which the reactor is operated, i.e. temperature, vacuum pressure, flow rates of reactant gases, radiation wavelength, and radiation intensity can all be varied to achieve desired deposition rates, thicknesses, and compositions. The monitor 78 provides information on the deposition rates and layer thickness to allow control of the above variables during reactor operation to ensure deposition of layers of predetermined composition and thickness.

The above-described apparatus may be used to carry out a variety of photochemical vapor deposition processes, including the deposition of oxide materials as discussed in U.S. Pat. Nos. 4,371,587 and 4,419,385, the deposition of nitride materials as discussed in U.S. Pat. No. 4,181,751, the deposition of sulfide materials and formation of native sulfide layers as discussed in U.S. Pat. No. 4,447,469, and the formation of native oxide layers as discussed in allowed patent application Ser. No. 517,930. In the formation of a native oxide or native sulfide it should be noted that only one vapor phase reactant is provided, which upon radiation-inducement reacts with the substrate surface and converts the surface atoms thereof to the oxide or sulfide. When used for photochemical vapor deposition processes, the apparatus of the present invention maximizes radiation transmission into the reaction zone in order to enhance deposition rates, while at the same time providing a uniform distribution of the reactant gases and the reaction-inducing radiation to produce a deposit of uniform composition and thickness on each substrate and deposits which are uniform from one substrate to the next in a given batch. Further, the apparatus of the present invention is capable of processing a relatively large number of substrates at one time and is particularly well suited for a production environment. Moreover, the apparatus of the present invention is capable of extensive continuous periods of operation (i.e. up to 50 hours or more) as may be required for certain complex applications of photochemical vapor deposition processes.

In view of the high degree of process control and uniformity of the deposited material, the apparatus of the present invention has been found to be particularly well suited for the deposition of a graded index material as described in copending patent application Ser. No. 528,833, assigned to the present assignee. In the latter process, a chosen substrate is exposed under radiation to two or more selected vapor phase reactants (e.g. $SiH_4$ and $N_2O$) which interact to produce the chosen material. By varying the relative proportions of the reactants in a predetermined and continuous sequence, there are produced continuous gradations in the stoichiometric composition of the chosen material deposited (e.g. $SiO_2$ to SiO) and corresponding gradations in the refractive index of the deposited layer as a function of thickness of the layer and in a predetermined pattern. The use of the apparatus and method of the present invention to deposit such a graded index material is set forth in the Example below.

EXAMPLE

This example illustrates the use of the apparatus and method of the present invention to deposit a continuously graded index layer of silicon oxides on a plastic goggle lens.

The apparatus of the present invention was constructed as previously described herein with regard to the preferred embodiment of the invention and had the following specific dimensions, among others: (a) the inside diameter of the outer reactor shell 12 was about 11 inches (28 cm) and its inside length was about 18 inches (47.5 cm); (b) the outside diameter of the inner shell 34 was about 6 inches (15 cm); (c) the inside diameter of the cooling tube 32 was about 4.5 cm; (d) the distance between the gas outlets in the gas distribution tubes was about 2.5 cm and the opening of each gas outlet was about 0.015 inch (0.6 mm); (e) the distance between the gas distribution tubes and the outer wall of the inner shell was about 2.5 cm; (f) the number of gas distribution tubes used was four; (g) the distance between the substrate and the centers of the ultraviolet lamps was about 9 cm; (h) the number of mercury vapor lamps used was eight; (i) the number of wiper blades used was four.

The apparatus of the present invention is used as previously described herein. The substrates are plastic lenses for use in protective goggles, formed of polycarbonate, having dimensions of approximately 9 centimeters by 17 centimeters. The substrates are attached to the inner surface 20 of outer reactor shell 12 by inserting a screw through a hole in the nosepiece portion of each lens and through a matching hole in the surface 20. After the reaction zone is sealed, vacuum-producing means 77 is activatd to produce a vacuum pressure of about $10^{-3}$ torr (millimeter of mercury). The reactant gases are silane ($SiH_4$), nitrous oxide ($N_2O$), and mercury vapor, which are combined in predetermined ratios variable with time. These gases are then introduced as a mixture through control valve 82 into shaft conduit 70 and to gas distribution tubes 58.

For preparation of the reactant gas mixture, the gas flow rate of $N_2O$ is held constant at 62.0 standard cubic centimeters per minute (sccm) and the flow rate of $SiH_4$ is varied in a controlled manner with time, within the range from about 0.85 to 6.5 sccm. The mixture of $SiH_4$ and $N_2O$ is further mixed with mercury by passing the mixture through a chamber containing a pool of mercury at room temperature having mercury vapor above it, at a vapor pressure of $10^{-3}$ torr (millimeters of mercury) at 20° C. After introduction of the reactant gas mixture into the reaction zone, the operating pressure within the reaction zone is adjusted to a pressure of about 0.2 torr (millimeter of mercury).

The heating elements 24 are activated by applying a voltage thereto and are adjusted to produce a substrate temperature of about 100° C. Cooling air is passed through cooling tube 32 to maintain the ultraviolet lamps at a temperature of about 50° C. The protective liquid Fomblin Y25 is introduced through conduit 46 under control of valve 48, and motor 72 is activated to produce rotary motion of the cage structure comprising rings 54 and 56, wiper blades 52, and gas distribution tubes 58, at a speed of about 6 rpm.

Finally, the low pressure mercury vapor lamps are activated and emit radiation having a primary wavelength at 2537 angstroms, which initiates the mercury-sensitized photochemical reaction between $SiH_4$ and $N_2O$. By controlling the relative proportions of the reactants, as described in previously referenced patent application Ser. No. 528,833, deposited material varying in a continuous manner from $SiO_2$ with a refractive index of 1.45 to SiO with a refractive index of 1.9 can be obtained. The quality of the material being deposited at various points in time during the deposition process is monitored by monitoring device 78. The deposition process is conducted under controlled reactant gas flow rates for the period of time required to provide a deposited layer having a predetermined thickness.

Having thus described exemplary embodiments of the present invention, it should be noted by those skilled in the art that the disclosures herein are exemplary only and that various other alternatives, adaptations and modifications may be made within the scope of the present invention. Thus, by way of example, and not of limitations, if desired, the wiper blades 52 and gas distribution tubes 58 may be mounted independently within the reactor so that they may be rotated at different speeds rather than being mounted to form a single cylindrical cage structure in which they both are rotated at the same speed. Further, as an optional means of achieving relative rotation between the gas distribution tubes 58 and the substrates 62, means may be provided for rotating the substrate holder about the inner surface 20 of the side wall 18 of outer reactor shell 12 while the gas distribution tubes 58 remain stationary. Moreover, while the apparatus of the present invention has been particularly described with regard to a vertical orientation of the barrel reactor, it is recognized that it may be advantageous to place the barrel reactor in a horizontal orientation and use a longer barrel in order to accommodate a larger number of substrates at one time, such as in a semiconductor device production environment. Accordingly, the present invention is not limited to the specific embodiments as illustrated herein and is only limited by the following claims.

What is claimed is:

1. A method for forming a layer of a selected material on the surface of a chosen substrate, said selected material being the product of a photochemical vapor reaction of one or more selected vapor phase reactants, said reaction being induced by radiation of a predetermined wavelength or combination of wavelengths, said method comprising the steps of:
    (a) providing an outer reactor shell having an inner wall defining the outer limit of a photochemical reaction zone;
    (b) providing an inner shell concentric with said outer reactor shell, having an outer wall defining the inner limit of said reaction zone, having an inner wall defining a central space in said apparatus, said outer and inner walls being transparent to said radiation of predetermined wavelength or combination of wavelengths;
    (c) mounting one or more substrates at spaced locations adjacent said inner wall of said outer reactor shell;
    (d) introducing said selected vapor phase reactants into said reaction zone through a gas manifold having a plurality of spaced outlets directed towards said inner wall of said outer reactor shell, said gas outlets being moved relative to said inner wall to provide uniform distribution of said vapor phase reactants within said reaction zone;
    (e) producing radiation of a predetermined wavelength or combination or wavelengths sufficient to induce said photochemical vapor reaction to form said layer, said radiation being produced by radiation means located within said central space in said apparatus and isolated from said reaction zone by said inner shell, wherein the quantity and uniformity of said radiation transmitted into said reaction zone is maximized, to thereby provide a uniform said layer of said selected material and an enhanced rate of deposition of said layer.

2. A method according to claim 1 wherein said outer reactor shell and said inner shell are concentric cylinders.

3. A method according to claim 1 which further includes maintaining said outer wall of said inner shell in a transparent state throughout said photochemical vapor reaction by preventing deposition of said selected material on said outer wall by:
    (a) introducing a first portion of a predetermined material in liquid form onto the top portion of said outer wall of said inner shell, said predetermined material being transparent to said radiation of a predetermined wavelength or combination of wavelengths and having a low adhesive affinity for said selected material;
    (b) spreading said predetermined material into a uniform relatively thin film covering said outer wall of said inner shell;
    (c) collecting said predetermined material that flows down from said to portion of said outer wall to the bottom portion of said outer wall and separates therefrom;
    (d) introducing second and subsequent portions of said predetermined material onto the top portion of said outer wall and repeating steps "b" and "c".

4. A method according to claim 3 wherein said spreading comprises moving wiper means across said outer wall of said inner shell.

5. A method according to claim 4 wherein said wiper means and said gas manifold are positioned to form a cylindrical cage structure which is concentrically located between said outer reactor shell and said inner shell, said method including the step of rotating said cage structure to provide said uniform distribution of said vapor phase reactants and said spreading of said predetermined material into said film.

* * * * *